US008405284B2

(12) United States Patent
Ichikawa

(10) Patent No.: US 8,405,284 B2
(45) Date of Patent: Mar. 26, 2013

(54) IMPACT-RESISTANT PIEZOELECTRIC DEVICES

(75) Inventor: Ryoichi Ichikawa, Saitama (JP)

(73) Assignee: Nihon Dempa Kogyo Co. Ltd., Tokyo (JP)

( * ) Notice: Subject to any disclaimer, the term of this patent is extended or adjusted under 35 U.S.C. 154(b) by 701 days.

(21) Appl. No.: 12/653,918

(22) Filed: Dec. 16, 2009

(65) Prior Publication Data

US 2010/0148634 A1    Jun. 17, 2010

(30) Foreign Application Priority Data

Dec. 17, 2008    (JP) .................................. 2008-321000

(51) Int. Cl.
 *H01L 41/08*    (2006.01)
(52) U.S. Cl. ......................................... 310/348; 310/370
(58) Field of Classification Search .................. 310/344, 310/345, 348, 340, 370, 354, 357, 311, 364, 310/365; 331/158; *H01L 41/08*
 See application file for complete search history.

(56) References Cited

U.S. PATENT DOCUMENTS

| 7,067,966 B2 * | 6/2006 | Tanaya ........................... 310/367 |
| 7,521,846 B2 * | 4/2009 | Tanaya ........................... 310/370 |
| 8,154,178 B2 * | 4/2012 | Ichikawa et al. ............... 310/344 |
| 8,227,958 B2 * | 7/2012 | Inoue et al. .................... 310/344 |
| 2007/0228891 A1 * | 10/2007 | Tanaya ........................... 310/348 |

FOREIGN PATENT DOCUMENTS

| JP | S54-58395 | 5/1979 |
| JP | 2003-133883 | 5/2003 |
| JP | 2004-208237 | 7/2004 |
| JP | 2006-352771 | 12/2006 |
| JP | 2007-228431 | 9/2007 |
| JP | 2008-118501 | 5/2008 |

OTHER PUBLICATIONS

Office Action issued in corresponding JP Application No. 2008-321000.
Office Action for related Japanese Patent Application No. 2008-321000.

* cited by examiner

*Primary Examiner* — Thomas Dougherty
*Assistant Examiner* — Karen B Addison
(74) *Attorney, Agent, or Firm* — Klarquist Sparkman, LLP

(57) ABSTRACT

Piezoelectric devices are disclosed that include a chip plate sandwiched between a lid plate and a base plate. The chip plate includes a tuning-fork type piezoelectric vibrating piece surrounded by an outer frame. The lid plate includes a concavity on its inner major surface, and the base plate includes a concavity on its inner major surface. The lid plate, chip plate, and base plate are bonded together to form a package containing the piezoelectric vibrating piece. The tuning-fork type piezoelectric vibrating piece includes a base having an X-direction width and at least pair of vibrating arms extending from the base in a Y-direction. The tuning-fork type piezoelectric vibrating piece is coupled to the outer frame by supporting arms extending in the Y-direction outboard of the vibrating arms. The concavity of the lid plate includes at least one base-movement "buffer" extending in the X-direction at a location corresponding to the base of the vibrating piece. The concavity of the base plate includes at least one base-movement buffer extending in the X-direction at a location corresponding to the base.

20 Claims, 7 Drawing Sheets

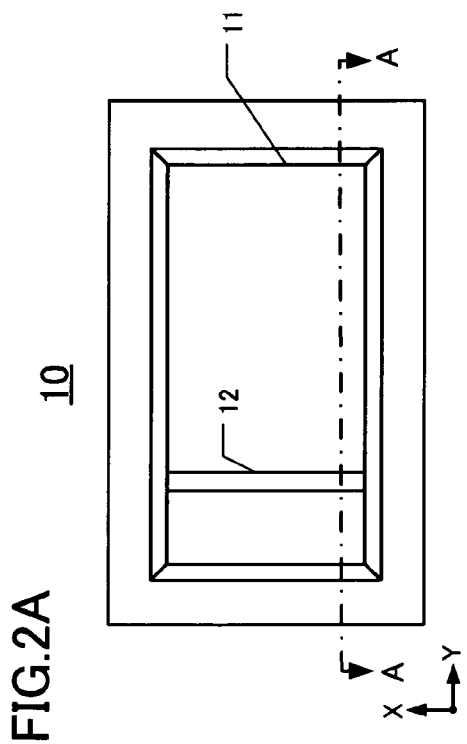

IMPACT-RESISTANT PIEZOELECTRIC DEVICES

CROSS-REFERENCE TO RELATED APPLICATION

This application claims priority to and the benefit of Japan Patent Application No. 2008-321000, filed on Dec. 17, 2008, in the Japan Patent Office, the disclosure of which is incorporated herein by reference in its entirety.

FIELD

This disclosure pertains to, inter alia, piezoelectric devices having improved impact resistance such as resistance to dropping impact.

DESCRIPTION OF THE RELATED ART

In small data devices, such as HDDs (Hard Disc Drives), mobile computers, IC cards, or clock sources for mobile phones, piezoelectric devices are often used. Example piezoelectric devices include piezoelectric vibrating pieces and piezoelectric oscillators. A conventional piezoelectric device as described in U.S. Pat. No. 7,443,086 is shown in elevational section in FIG. 7. The depicted piezoelectric device 90 comprises a piezoelectric vibrating piece 93 mounted on and in a package base 91. The device 90 includes a lid 92 that covers the piezoelectric vibrating piece inside the package base and thus seals the package. (Thus, a "piezoelectric device" as used herein comprises the piezoelectric vibrating piece and its package containing the piezoelectric vibrating piece). As understood from this drawing, as the size of the piezoelectric device is reduced, the space provided by the package for housing the piezoelectric vibrating piece 93 must be made correspondingly smaller.

Whenever an impact force F in a vertical direction (denoted by an arrow) is applied to the piezoelectric vibrating piece 93, such as by dropping the piezoelectric device, the piezoelectric vibrating piece 93 momentarily deforms. During such deformation, the region 95 at which the piezoelectric vibrating piece 93 is mounted to the package base 91 behaves as a fulcrum relative to which the distal tips of the vibrating piece 93 move and can collide with the package base 91 and/or lid 92. These collisions usually cause fracture or deformation of the piezoelectric vibrating piece and also adversely affect the CI value and/or the oscillation frequency of the piece.

An approach for reducing fracture and/or deformation of the piezoelectric vibrating piece 93 caused by impact forces is discussed in the '086 patent cited above and shown in FIG. 7. According to the '086 patent, the package base 91 includes a concavity 94 in the inner surface thereof, adjacent the distal ends of the vibrating arms of the piezoelectric vibrating piece 93. Also, on the same surface of the package base but on the opposite end is a "buffer" portion 96. As a result of these features, impact-caused collisions of the piezoelectric vibrating piece 93 with the inner surface of the package base 91 in the vicinity of the concavity 94 are substantially reduced, which prevents fractures and operational damage.

SUMMARY

Referring further to FIG. 7, the concavity 94 and buffer portion 96 the distal ends of the piezoelectric vibrating piece 93 from colliding with the package base 91. However, these features do not prevent impact-caused collisions of the vibrating arms with the lid 92. Also, as the piezoelectric device 90 is further miniaturized, the space available for forming the concavity 94 is correspondingly reduced, which compromises the impact resistance that the package can provide. In FIG. 7, since the buffer portion 96 has a location corresponding to the most distal end of the piezoelectric vibrating piece 93, the most fragile portion (i.e., the most distal end of the base of the piezoelectric vibrating piece) tends to collide with the buffer portion 96. Consequently, the configuration discussed in the '086 patent actually does not provide a significant reduction in actual impact-caused fracture of the piezoelectric vibrating piece.

Hence, an object of the invention is to provide piezoelectric devices that sufficiently and securely prevent fracture and/or deformation of portions of the devices that otherwise would be caused by physical impacts applied to the devices. The reductions in fracture and/or deformations persist even whenever the devices have been miniaturized.

According to a first aspect of the invention, piezoelectric devices are provided. An embodiment of such a device comprises a chip plate sandwiched between a lid plate and a package base ("base plate"). The lid plate and base plate have respective concavities on their respective inner major surfaces (i.e., respective surfaces facing the chip plate). The chip plate comprises a tuning-fork type piezoelectric vibrating piece and an outer frame that surrounds the tuning-fork type piezoelectric vibrating piece. The chip plate, lid plate, and base plate are bonded together to form a package containing the piezoelectric vibrating piece inside. The tuning-fork type piezoelectric vibrating piece has an X-direction width and a Y-direction length and comprises a base and at least pair of vibrating arms extending in the Y-direction from the base. (These specified directions facilitate comprehension of relative axes of the plates and of the package). The tuning-fork type piezoelectric vibrating piece is coupled to the outer frame by a pair of supporting arms that extend outboard of the vibrating arms in the Y-direction between the base and the outer frame. The supporting arms are connected to the outer frame by respective connecting portions. The lid plate includes a respective "base-movement buffer" situated in the concavity at a Y-coordinate (i.e., position along the Y-axis) corresponding to a Y-coordinate of the base. This buffer is a ridge or analogous feature extending from the concavity toward the base of the vibrating piece to limit the deflection of the base resulting from an impact. Similarly, the base plate includes a respective base-movement buffer situated in the concavity at a Y-coordinate corresponding to a Y-coordinate of the base. The base-movement buffers on the lid plate and base plate prevent breakage or deformation of the base of the piezoelectric vibrating piece that otherwise would result from collision of the base with the lid plate or base plate accompanying a physical impact. An exemplary physical impact is caused by dropping the package on a rigid surface. Thus, the buffers protect the piezoelectric vibrating piece from impact damage.

The respective Y-coordinates of the base-movement buffers on the lid plate and base plate desirably are established relative to respective Y-direction distances of the respective base-movement buffers from a most distal end of the base. This configuration prevents collision of the most distal end of the base with either of the base-movement buffers. More specifically, this configuration prevents damage to the most distal end of the base, which otherwise is easily chipped if struck. Thus, impact breakage of the piezoelectric vibrating piece is prevented. Also, since each buffer is located with consideration given to the distance between the piezoelectric vibrating piece and the lid plate and to the distance between the piezoelectric vibrating piece and the base plate, collisions are reliably prevented.

The vibrating arms include a "crotch region" between them on the base. In certain embodiments each vibrating arm comprises a respective arm portion extending from the crotch region to a respective distal end of the arm. Each of these vibrating arms also comprises a respective hammer-head portion connected to the respective distal end. Each hammer-head portion is wider in the X-direction than the distal end of the respective vibrating arm portion. To limit the deflection of the vibrating arms during an impact event, the concavity of the lid plate includes a lid arm-movement buffer having a Y-coordinate corresponding to a region of the arm portions situated adjacent respective hammer-head portions. Similarly, the concavity of the base plate includes a base arm-movement buffer having a Y-coordinate corresponding to a region of the arm portions situated adjacent respective hammer-head portions. By providing arm-movement buffers on both on the lid plate and the base plate, excess deflection of the vibrating arms results in only the arm portions, not the hammer-head portions, contacting the buffers. Thus, the hammer-head portions are prevented from striking the lid plate and/or base plate, which reduces or prevents fractures and deformations of the vibrating arms.

In certain embodiments the base-movement buffer on the base plate comprises respective first and second base-movement buffers. Similarly, the base-movement buffer on the lid plate comprises respective first and second base-movement buffers. The first base-movement buffer on the base plate has a Y-coordinate that is located a first Y-direction distance from an X-direction centerline of the connecting portions. This X-direction centerline denotes a fulcrum line of the base and vibrating arms. Similarly, the second base-movement buffer on the base plate has a Y-coordinate that is located a second Y-direction distance from the X-direction centerline. The first base-movement buffer on the lid plate has a Y-coordinate that is located a first Y-direction distance from the X-direction centerline, and the second base-movement buffer on the lid plate has a Y-coordinate that is located a second Y-direction distance from the X-direction centerline. For the base-movement buffers on the lid plate, a Y-direction distance between the Y-coordinate of the first base-movement buffer and the base and a Y-direction distance between the second base-movement buffer and the base are proportional to the first and second distances, respectively. For the base-movement buffers on the base plate, a Y-direction distance between the Y-coordinate of the first base-movement buffer and the base and a Y-direction distance between the second base-movement buffer and the base are proportional to the first and second distances, respectively. Thus, each buffer has a respective height that depends upon the distances from the X-direction centerline, which provides effective clearances between each buffer and the piezoelectric vibrating piece, and provides good oscillation performance.

Multiple buffers having different respective heights that depend upon Y-direction distances from the X-direction centerline avoid collisions of the piezoelectric vibrating piece with the lid and base plates. Multiple buffers also provide more absorption of arm and base movements resulting from physical impacts at the most distal ends of the piezoelectric vibrating piece.

In other embodiments the base-movement buffer on the base plate comprises respective first and second base-movement buffers, and the base-movement buffer on the lid plate comprises respective first and second base-movement buffers. The first base-movement buffer on the base plate has a Y-coordinate that is located a first Y-direction distance from an X-direction centerline of the connecting portions. The second base-movement buffer on the base plate has a Y-coordinate that is located a second Y-direction distance from the X-direction centerline. The first base-movement buffer on the lid plate has a Y-coordinate that is located a first Y-direction distance from the X-direction centerline, and the second base-movement buffer on the lid plate has a Y-coordinate that is located a second Y-direction distance from the X-direction centerline. For the base-movement buffers on the lid plate, a Y-direction distance between the Y-coordinate of the first base-movement buffer and the base and a Y-direction distance between the second base-movement buffer and the base are proportional to the first and second distances, respectively. For the base-movement buffers on the base plate, a Y-direction distance between the Y-coordinate of the first base-movement buffer and the base and a Y-direction distance between the second base-movement buffer and the base are proportional to the first and second distances, respectively. Thus, again, each buffer has a respective height that depends upon distance from the X-direction centerline. This feature also allows inclusion of spaces between each buffer and the piezoelectric vibrating piece. Multiple buffers having various respective heights (that depend upon distance from the X-direction centerline) avoid damaging collisions of the piezoelectric vibrating piece with the lid and/or base plates during physical impact to the package. The multiple buffers also reduce stress at the most distal ends (vibrating arms and base) of the piezoelectric vibrating piece and protect them from damage.

The Y-coordinate of the base-movement buffer on the lid plate desirably corresponds to the crotch region between the vibrating arms on the base. Similarly, the Y-coordinate of the base-movement buffer on the base plate desirably corresponds to the crotch region. As noted above, the X-direction centerline, serving as a connection axis of attachment of the vibrating piece to the outer frame via the connecting portions. The X-direction centerline is effectively a fulcrum about which various portions of the piezoelectric vibrating piece move when physically impacted. The crotch region desirably is situated adjacent the fulcrum so that accelerations of the crotch region caused by physical impacts are small. Thus, the base-movement buffers, formed at location(s) corresponding to the crotch region, prevent fracture of the piezoelectric vibrating piece by physical impacts.

The base-movement buffer located on the lid plate and the arm-movement buffer located on the lid plate can have respective X-direction widths that are less than or equal to an X-direction width of the concavity on the lid plate. Similarly, the base-movement buffer located on the base plate and the arm-movement buffer located on the base plate can have respective X-direction widths that are less than or equal to an X-direction width of the concavity on the base plate.

According to the various embodiments as described and claimed herein, the most distal ends of the piezoelectric vibrating piece are protected from breakage or deformation otherwise caused by collisions of the distal ends with the lid plate and/or base plate during physical impacts, particularly physical impacts involving application of vertical (Z-direction) impact force to the device. Thus, variations in vibration frequency caused by impact forces are reduced. Also, the piezoelectric devices including buffers can be further miniaturized without limiting the interior space of the package.

BRIEF DESCRIPTION OF THE DRAWINGS

FIG. 2A is a plan view of the inner surface of a lid of the first embodiment of a piezoelectric device.

FIG. 2B is a plan view of a unit ("chip plate") of piezoelectric material, including a frame and a piezoelectric vibrating piece, of the first embodiment.

FIG. 2C is a plan view of the inner surface of the package base 30 of the first embodiment.

FIG. 2D is an elevational section of the first embodiment of a piezoelectric device, along the line A-A in FIG. 2A.

DETAILED DESCRIPTION

First Embodiment of Piezoelectric Device

Figure 1:
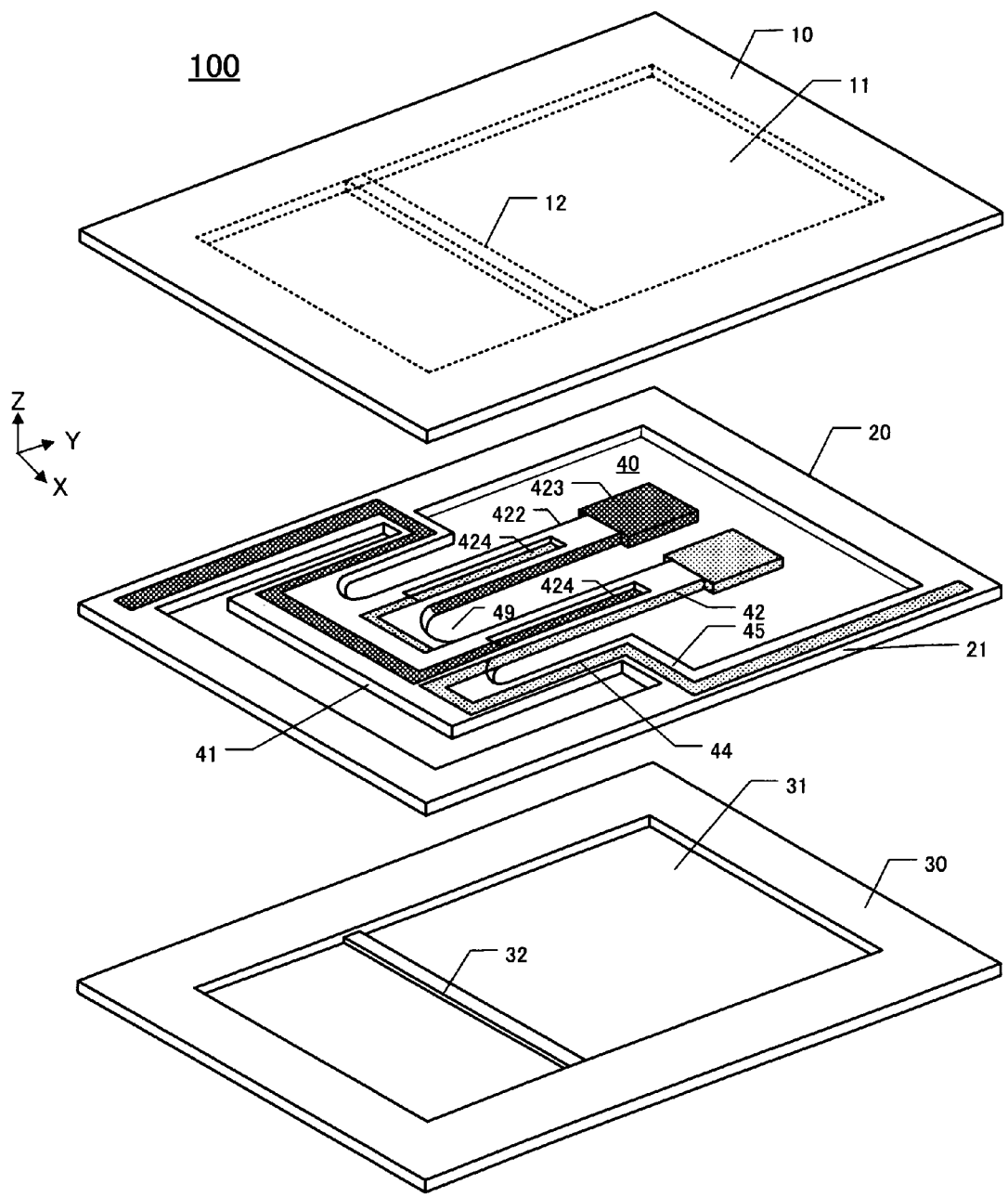
FIG. 1 is a perspective exploded view of a first embodiment of a piezoelectric device, showing the alignments and superpositions of the lid on the "chip plate" and of the chip plate on the package base.

In this embodiment, the subject piezoelectric device is also termed a piezoelectric "oscillator" or piezoelectric "vibrator." FIG. 1 is a perspective exploded view of the first embodiment 100. In general, a "piezoelectric device" is a device including a "chip plate" (comprising piezoelectric vibrating "piece" and surrounding "outer frame" made of piezoelectric material), a lid (or "lid plate"), and a package base (or "base plate"). The chip plate is sandwiched between the lid and package base, which are bonded together in the Z-direction to form a packaged device. Bonding of these three plates together can be performed by, for example, siloxane bonding (Si—O—Si) or anodic bonding.

The package lid 10 comprises a concavity 11 formed by etching into the major surface thereof facing the chip plate 20. The chip plate 20 comprises a piezoelectric vibrating piece 40 situated substantially at the center of the chip plate. The chip plate 20 also includes an outer frame 21 that surrounds the piezoelectric vibrating piece 40. In this embodiment the piezoelectric vibrating piece 40 is a very small tuning-fork type piezoelectric vibrating piece that, by way of example, oscillates at a frequency of 32.768 kHz.

The piezoelectric vibrating piece 40 comprises a base 41, a pair of vibrating arms 42 that extend from the base 41 in a designated direction (here, the Y-direction), and a pair of supporting arms extending outboard of the vibrating arms 42. Each vibrating arm 42 comprises an arm portion 422 that extends from the base 41 and a hammer-head portion 423 situated on the distal end of the arm portion 422. The hammer-head portion 422 has greater width (in the X-direction) than the arm portion 422. Each vibrating arm 42 also comprises respective electrodes formed by vacuum evaporation or sputtering on each of the upper, lower, and side surfaces thereof, as well as on the base 41. By way of example, each of these electrodes has a two-layer structure in which an Au layer of 400 to 2000 Ångstroms thickness is formed on a sub-layer of chromium (Cr) of 150 to 700 Ångstroms thickness. Titanium (Ti) can be used instead of chromium for the sub-layer, and silver (Ag) can be used instead of gold (Au) for the top layer. As an alternative to this two-layer structure, each electrode can be formed of an alloy of aluminum (Al) and copper (Cu), wherein Cu is the main component, to obtain favorable adhesion, corrosion resistance, electrical conductivity, and heat resistance.

The supporting arms 44 extend from respective regions of the base 41. The supporting arms 44 extend, mainly in the Y-direction, outboard of the respective vibrating arms 42 and couple the base 41 to the outer frame 21. The supporting arms 44 are configured to prevent or inhibit conduction of vibrations from the vibrating arms 42 to outside the piezoelectric device 100. The supporting arms 44 also reduce adverse influences of changes in external temperature and/or physical impacts caused by, for example, dropping the piezoelectric device.

The package base 30 comprises a concavity 31 on its inner major surface facing the chip plate 20. The package base 30 can include through-holes and respective external electrodes as required for making electrical connections into and out of the package.

FIG. 2A is a plan view of the inner major surface of the lid plate 10 of this embodiment 100, FIG. 2B is a plan view of the chip plate 20 (including a piezoelectric vibrating piece 40), and FIG. 2C is a plan view of the inner major surface of the package base 30. FIG. 2D is an elevational section of this embodiment along the line A-A in FIG. 2A.

In FIG. 2A the concavity 11 in the lid plate 10 comprises a base-movement buffer 12 that faces the chip plate 20 and has a Y-direction coordinate corresponding to the Y-coordinate of a "crotch" or "root" region 49 of the vibrating arms 42. In FIG. 2C the concavity 31 of the base plate 30 comprises a base-movement buffer 32 that faces the chip plate 20 and also has a Y-direction coordinate corresponding to the Y-direction coordinate of the crotch region 49 of the vibrating arms 42 and corresponding to the Y-direction coordinate of the base-movement buffer 12.

The base-movement buffers 12 and 32 are now described. As shown in FIGS. 2A and 2C, the base-movement buffers 12, 32 are situated at respective Y-direction locations corresponding to the crotch region 49 of the vibrating arms 42. In this embodiment the base-movement buffers 12, 32 are situated at substantially identical Y-coordinates, corresponding to respective locations of the crotch regions 49. Alternatively, the base-movement buffers 12, 32 can be slightly displaced from each other in the Y-direction.

In FIG. 2D the height H1 of the base-movement buffer 12 in the Z-direction is less than the depth H2 of the concavity 11 in the lid plate 10 so as not to interfere with vibration of the piezoelectric vibrating piece 40. The height H3 of the base-movement buffer 32 in the Z-direction is less than the depth H4 of the concavity 31 in the base plate 30 so as not to interfere with vibration of the piezoelectric vibrating piece 40.

Figure 3A:
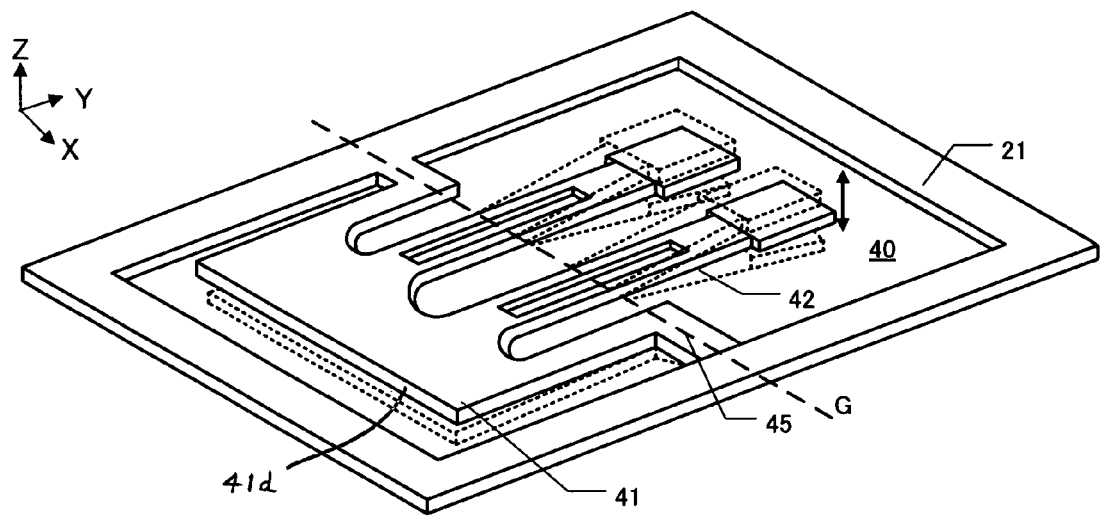
FIG. 3A is a schematic perspective view of the piezoelectric vibrating piece 40 of the first embodiment, showing deflection of the vibrating arms caused by a dropping impact or other physical shock.
Figure 3B:
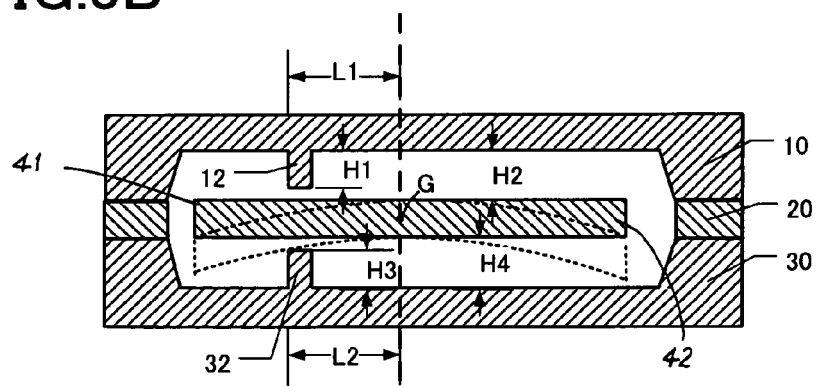
FIG. 3B is a simplified elevational section of the first embodiment, showing the lid, the chip plate, and the package base bonded to each other, and showing an exemplary deflection of the piezoelectric vibrating piece that would be caused by a physical impact.

Referring to FIGS. 3A and 3B, the respective heights of the base-movement buffers 12, 32 and the effectiveness of these buffers in protecting the piezoelectric vibrating piece 40 from dropping impacts are now described. FIG. 3A is a schematic perspective view of the chip base 20 showing an exemplary deflection of the piezoelectric vibrating piece 40 caused by a dropping impact. FIG. 3B is a simplified elevational section showing the lid plate 10 bonded to the chip plate 20, and the chip plate bonded to the package base plate 30. Also shown is an exemplary deflection of the piezoelectric vibrating piece caused by a dropping impact.

In FIG. 3A, the piezoelectric vibrating piece 40 is coupled to the outer frame 21 of the chip plate 20 via connecting portions 45. Relative to the connecting portions 45 (and hence relative to the centerline G) are the distal ends of the vibrating arms 42 and the distal edge 41d of the base 41. Whenever the piezoelectric vibrating device 100 experiences a physical impact or shock such as from dropping the device on a hard surface, the piezoelectric vibrating piece 40 tends to deflect in the directions (Z-direction, denoted by double-headed arrow) relative to a centerline G. The centerline G extends in the X-direction along the X-direction centerlines of the connecting portions 45. Although FIG. 3A shows movement of distal ends of the vibrating arms 42 in both Z-directions, only downward motion of the distal end 41d of the base 41 is shown for simplicity. During such motion of the piezoelectric vibrating piece 40, the centerline G behaves as a fulcrum. Since the crotch regions 49 in the assembled package are adjacent to the fulcrum of the piezoelectric vibrating piece 40, vibrational accelerations (caused by the physical impact) at the crotch regions 49 are small. Therefore, fracture of the piezoelectric vibrating piece 40 by physical impact can be prevented efficiently by placing the base-movement buffers 12, 32 at locations, corresponding to the crotch regions 49, at which vibrational acceleration caused by physical impact is minimal.

As shown in FIG. 3B, whenever the piezoelectric vibrating device 100 experiences a physical impact or shock such as upon dropping the device on a hard surface, distal portions of the base 41 and vibrating arms 42 of the piezoelectric vibrating piece 40 tend to move downward relative to the centerline G. During this motion, the crotch region 49 of the piezoelectric vibrating piece 40 can contact the base-movement buffer 32 formed in the concavity 31 of the base plate 30. Thus, the base-movement buffer 32 prevents the most distal regions of the base 41 from colliding with the base plate 30.

Although not shown in FIG. 3B, whenever the piezoelectric vibrating piece 40 is accelerated abruptly upward by a physical impact or the like, the base 41 can move upward sufficiently for the distal end 41d to contact the base-movement buffer 12. But, the base-movement buffer 12 prevents further upward movement of the base 41, which prevents the distal end 41d of the base from colliding with the concavity in the lid plate. Thus, the base-movement buffer 12 substantially reduces the probability of the vibrating piece colliding with the lid plate 10, which correspondingly reduces the probability of damage to the vibrating piece resulting from physical impact.

The height H1 in the Z-direction of the base-movement buffer 12 is established depending on the distance L1, which is the distance between the base-movement buffer 12 to the centerline G. The centerline G also denotes the "connection line" along which the piezoelectric vibrating piece 40 is connected (via the connecting portions 45) to the outer frame. For example, as the distance L1 from the base-movement buffer 12 to the centerline G is increased, the height H1 of the base-movement buffer 12 is correspondingly reduced. This is because, during vibration movement of the piezoelectric vibrating piece 40, in which the vibrating arms move up and down, the vertical range of this vibration movement increases with increased distance from the centerline G.

The ratio of H1 to L1 desirably is established within a range in which the piezoelectric vibrating piece 40 is prevented from contacting the lid plate 10. Thus, the ratio of H1 to L1 corresponds to the depth H2 of the concavity 11. As the depth H2 is increased, the ratio of H1 to L1 becomes larger; as the depth H2 is reduced, the ratio of H1 to L1 becomes smaller. As a result, the space between the base-movement buffer 12 and the crotch region of the vibrating arms 42 is established so that the piezoelectric vibrating piece 40 does not contact the lid plate 10 during physical impacts, while allowing the piezoelectric vibrating piece to oscillate without any physical interference.

The height H3 in the Z-direction of the base-movement buffer 32 is established depending on the distance L2 (distance between the base-movement buffer 32 and the centerline G. The centerline G also denotes the line along which the piezoelectric vibrating piece 40 is connected to the outer frame. For example, as the distance between the base-movement buffer 32 to the centerline G is increased, the height H3 of the base-movement buffer 32 is correspondingly reduced. This is because, during vibration movement of the piezoelectric vibrating piece 40, in which the vibrating arms move up and down, the vertical range of this vibration movement increases with increased distance from the centerline G.

The ratio of H3 to L2 desirably is established within a range in which the piezoelectric vibrating piece 40 does not contact the lid plate 10. The ratio of H3 to L2 corresponds to the depth H4 of the concavity 13. As the depth H4 is increased, the ratio of H3 to L2 becomes larger; as the depth H4 is reduced, the ratio of H3 to L2 become smaller. As a result, the space between the base-movement buffer 32 and the crotch region of the vibrating arms 42 is established so that the piezoelectric vibrating piece 40 does not contact the base plate 30 during physical impacts, while allowing the piezoelectric vibrating piece to oscillate without any physical interference.

In this embodiment the base-movement buffer 12 formed on the lid plate 10 and the base-movement buffer 32 formed on the base plate 30 are situated at almost the same coordinates in the Y-direction. As a result the distances L1 and L2 are substantially equal. Whenever the depth H2 of the concavity 11 and the depth H4 of the concavity 31 are substantially equal, the heights H1 and H3 of the base-movement buffer 32 are substantially equal. But, if the base-movement buffers 12 and 32 are not situated at substantially the same corresponding Y-coordinate on the lid and base plate, the heights H1 and H3 desirably are different.

A piezoelectric device is manufactured by sandwiching a chip plate (including a piezoelectric vibrating piece) between a base plate and a lid plate, and then bonding these three plates together in a sealing manner. If the Z-direction depths H2 and H4 are different, the height H1 of the base-movement buffer 12 can be established depending upon the depth H2 of the concavity 11 and the distance L1 between the base-movement buffer 12 to the centerline G. The height H3 of the base-movement buffer 32 can be configured depend on the depth H4 of the concavity 31 and the distance L2 between the base-movement buffer 32 to the centerline G.

These buffers 12, 32 can be formed by etching, except in those locations in which the wafer is normally etched as the concavities 11 and 13 are being etched. The buffers 12, 32 also can be formed by etching after a protective film (defining locations in which the buffers are to be formed) has been applied to the wafer. The buffers 12, 32 can be formed by any of various known techniques, the descriptions of which are omitted.

Second Embodiment of Piezoelectric Device

In the following discussion of a second embodiment 200 of a piezoelectric device, components thereof that are similar to corresponding components of the first piezoelectric device have the same respective reference numerals and are not described further.

Figure 4:
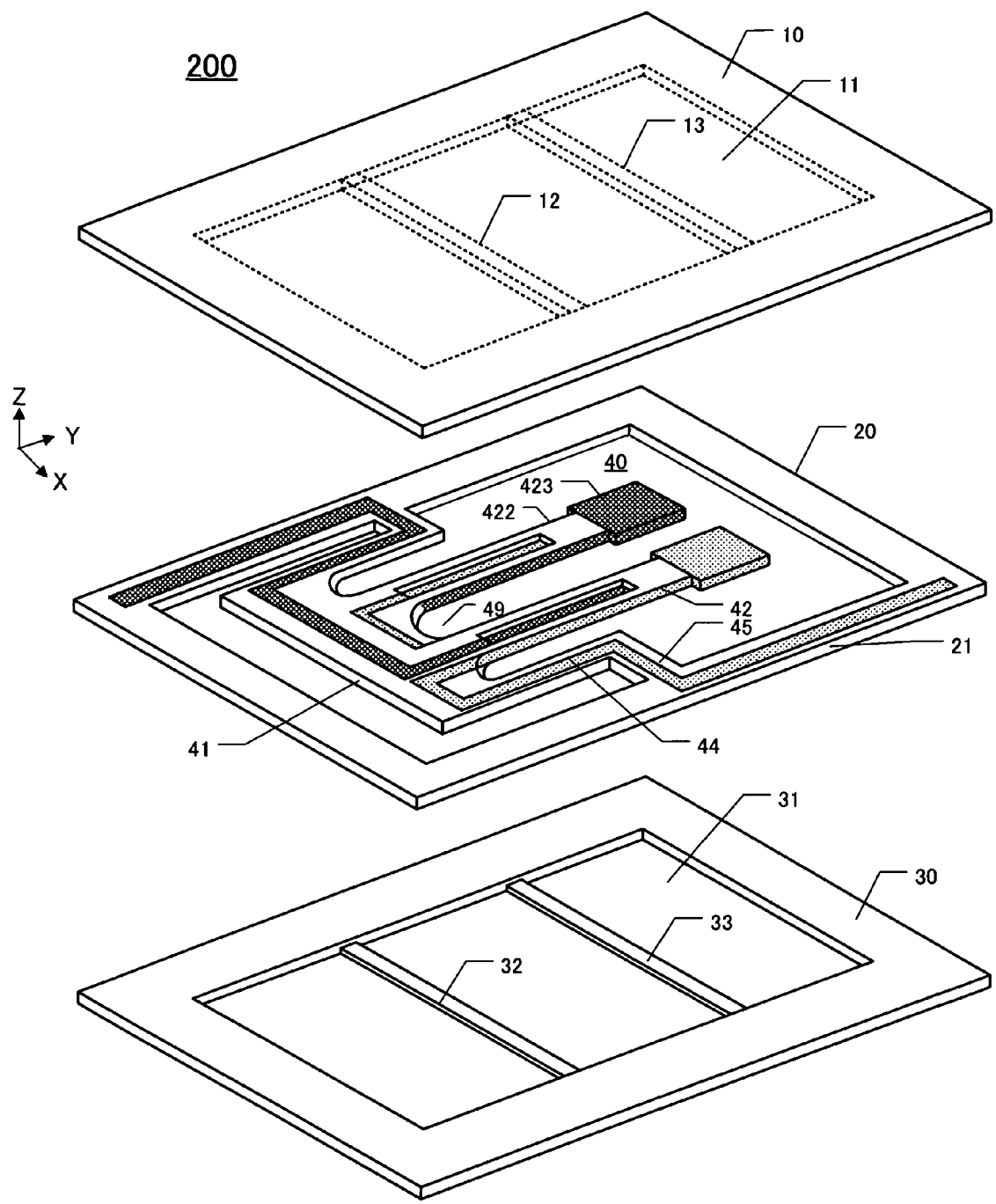
FIG. 4 is a perspective exploded view of a second embodiment of a piezoelectric device, showing the alignments and superpositions of the lid on the chip plate and of the chip plate on the package base.
Figure 5:
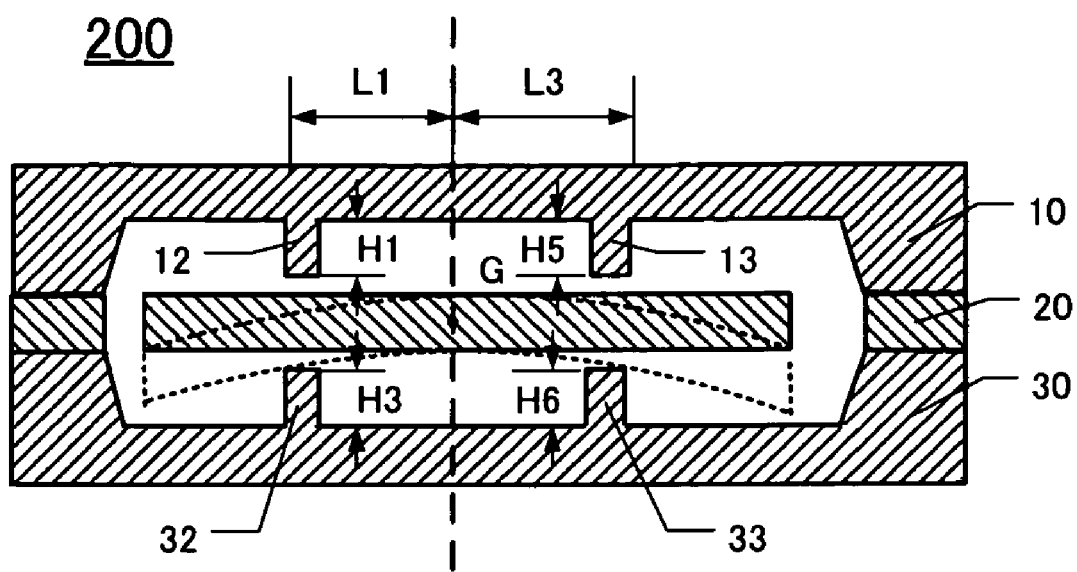
FIG. 5 is a simplified elevational section of the second embodiment, showing the lid, the chip plate, and the package base bonded to each other, and showing an exemplary deflection of the piezoelectric vibrating piece that would be caused by a physical impact.

FIG. 4 is a perspective view of this embodiment, depicting the mutual alignment of the lid plate 10, chip plate 20, and base plate 30. FIG. 5 is a simplified elevational section of the second embodiment, depicting the three plates 10, 20, 30 bonded together. In FIG. 4 the piezoelectric device 200 comprises a lid plate 10 including a concavity 11 on its inner major surface. An arm-movement buffer 13 is located in the concavity 11 at a Y-coordinate that corresponds to the Y-coordinate of the arm portion 422 adjacent the hammer-head portion 423 of the vibrating arms 42. The Y-coordinate of the arm-movement buffer 13 places the buffer at a designated distance from the distal end of the vibrating arms 42 to avoid detachment fracture of the fragile hammer-head portion 423 from the arm portion 422.

Also shown in FIG. 4 is the concavity 31 defined in the inner major surface of the base plate 30. In the concavity 31 is an arm-movement buffer 33 located at a Y-coordinate corresponding to the Y-coordinate of the arm-movement buffer 13 and to the Y-coordinate of the arm portion 422 adjacent the hammer-head portion 423. The arm-movement buffer 33 can be formed at a designated Y-direction distance from the distal ends 422 of the vibrating arms 42 to avoid fracture of the hammer-head portions 423 from the distal ends.

By locating the buffers 13, 33 to have substantially the same Y-coordinates as the arm portions 422 adjacent the hammer-head portions 423, the hammer-head portions 423 are protected reliably and unintended changes in vibration frequency are avoided.

The height H1 of the base-movement buffer 12 and the height H5 of the arm-movement buffer 13 are established based on the respective Y-direction distances L1 and L3 from the centerline G to each buffer. In FIG. 5, since the distance L1 is substantially equal to the distance L3, the height H1 of the base-movement buffer 12 is substantially equal to the height H5 of the arm-movement buffer 13. Similarly, the heights H3, H6 of corresponding buffers 32, 33 are established based on their respective Y-direction distances from the centerline G.

Furthermore, each buffer 12, 13 on the lid 10 and each buffer 32, 33 on the package base 30 is situated at a respective Y-direction location corresponding to the Y-direction location of the crotch region 49 of the piezoelectric vibrating piece 40 and to the arm portions 422. As a result, whenever an impact force is applied to the device 200 from a substantially vertical (Z) direction, the buffers both at the crotch region 49 and at the arm portions 422 inhibit extreme vibrational displacements of the piezoelectric vibrating piece 40 and prevent fracture that otherwise could result if the piezoelectric vibrating piece 40 were allowed to collide with the lid plate 10 and base plate 30. The configuration of this embodiment also prevent the respective distal ends of the hammer-head portions 423 and base 41 from contacting the buffers, the lid plate 10, and the base plate 30, thereby preventing fracture of the piezoelectric vibrating piece 40.

Third Embodiment of Piezoelectric Vibrating Device

In the following description of the third embodiment 300 of a piezoelectric device, components thereof that are similar to corresponding components of the second and first piezoelectric devices have the same respective reference numerals and are not described further.

Figure 6:
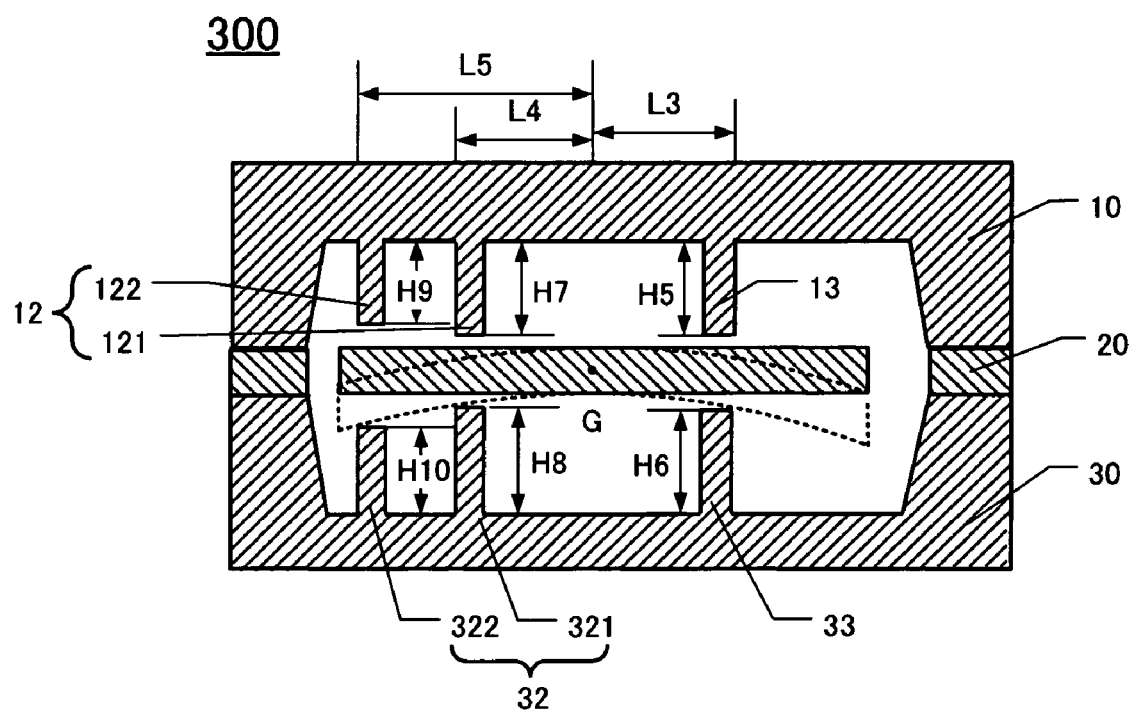
FIG. 6 is an enlarged elevational section of a third embodiment, showing the lid, the chip plate, and the package base bonded to each other, and showing an exemplary deflection of the piezoelectric vibrating piece that would be caused by a physical impact.
Figure 7:
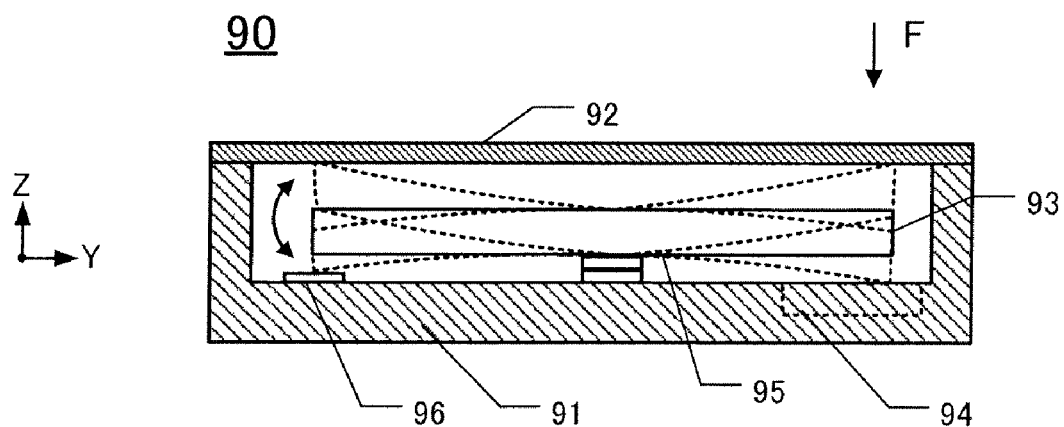
FIG. 7 is a simplified elevational section of a conventional piezoelectric device.

Reference is made to FIG. 6, which is an enlarged elevational section showing the chip plate 20 sandwiched between the lid plate 10 and base plate 30, which are all bonded together. The figure is accentuated in the vertical direction for increased clarity in showing the various heights discussed below.

The inner major surface of the lid plate 10 defines a concavity 11 that contains lid base-movement buffers 12 and a lid arm-movement buffer 13. The lid base-movement buffers 12 comprise a first lid base-movement buffer 121 having a Y-coordinate corresponding to the crotch region 40 of the vibrating arms 42. The lid base-movement buffers 12 also comprise a second lid base-movement buffer 122 situated a designated distance (in the Y-direction) from the distal edge of the base 41. The designated distance is not limited unless the distal edge of the base 41 does not collide with the second lid base-movement buffer 122.

The inner major surface of the base plate 30 also defines a concavity 31 that contains base base-movement buffers 32 and a base arm-movement buffer 32. The base base-movement buffers 32 comprise a first base base-movement buffer 321 having a Y-coordinate corresponding to the crotch region of the vibrating arms 42. The base base-movement buffers 33 also comprise a second base base-movement buffer 322 situated a designated distance (in the Y-direction) from the distal edge of the base 41. The designated distance is not limited unless the distal edge of the base 41 does not collide with the second base base-movement buffer 322.

The height H5 of the lid arm-movement buffer 13, the height H7 of the first lid base-movement buffer 121, and the height H9 of the second lid base-movement buffer 122 are established depending on the respective distances L3, L4, L5 from the buffers to the centerline G. In FIG. 6 the distance L5 between the second lid base-movement buffer 122 to the centerline G is greater than the distance L4 from the first lid base-movement buffer 121 to the centerline G. Thus, H9<H7 because the piezoelectric vibrating piece 40 exhibits greater vibrational deflection with increased distance from the centerline G. This allows shorter buffers at locations at greater distances from the centerline G.

The height H6 of the base arm-movement buffer 33, the height H8 of the first base base-movement buffer 321, and the height H10 of the second base base-movement buffer 322 are established depending on their respective distances from the centerline G, in the same manner as described above.

Among the various embodiments described above, the piezoelectric vibrating pieces are more resistant to fracture, compared to conventional vibrating pieces. For example, the embodiments avoid fracture of the distal ends of the vibrating piece 40, which are otherwise easily chipped or otherwise broken if subjected to a physical shock. In addition, the buffers situated on the lid plate and base plate effectively prevent collisions of delicate portions of the piezoelectric vibrating piece 40. Accelerations, imparted to the vibrating piece when subjected to physical impact forces, near the centerline G of the piezoelectric vibrating piece 40 are small. Consequently, adverse effects of the impact forces can be substantially reduced by the presence of the first lid base-movement buffer 121 and the first base base-movement buffer 321. These buffers reduce acceleration deflections of the most distal portions of the piezoelectric vibrating piece. Since the most distal portions normally experience the greatest deflections, and since the most distal portions tend to be the most delicate portions, reducing the deflections yields a corresponding reduction of fractures and other damage that otherwise would occur in conventional piezoelectric devices subjected to physical impacts.

In this third embodiment, the base-movement buffer 12 located on the lid includes a first lid base-movement buffer 121 and a second lid base-movement buffer 122. In a similar manner, the arm-movement buffer 13 on the lid can include a first lid arm-movement buffer (situated at a predetermined first distance in the Y-direction from the distal ends of the vibrating arms 42) and a second lid arm-movement buffer (situated at a predetermined second distance in the Y-direction from the distal ends of the vibrating arms 42) to provide even better protection of the hammer-head portions 423 of the vibrating arms from impact fracture. In the same manner, the arm-movement buffer 33 located on the package base can include a first base arm-movement buffer (situated at a predetermined first distance in the Y-direction from the distal ends of the vibrating arms 42) and a second base arm-movement buffer (situated at a predetermined second distance in the Y-direction from the distal ends of the vibrating arms).

Piezoelectric devices encompassed by the invention are described above in connection with several embodiments. However, it will be understood that the invention is not limited to the described embodiments. It will be obvious to persons of ordinary skill in the relevant art to modify the invention based on this disclosure. For example, the movement buffers can be formed of the same material as the respective lid 10 and package base 30. Alternatively, the movement buffers can be formed of a cushioning material mounted to the frame, package base, lid, and or supporting arm using an adhesive or the like. Also, in the described embodiments, the chip plate 20 including piezoelectric vibrating piece and outer frame is sandwiched between the lid and package base to form a "package." In this configuration, buffers can be formed on the package and the lid plate. In the embodiments as depicted, a buffer can be configured as being of substantially the same width, in the lateral (X-axis) direction, of the lid plate and base plate. Alternatively, a buffer can be configured as having only a portion of this width.

What is claimed is:

1. A piezoelectric device, comprising:
a lid plate comprising a concavity on its inner major surface;
a chip plate comprising a tuning-fork type piezoelectric vibrating piece and an outer frame surrounding the tuning-fork type piezoelectric vibrating piece; and
a base plate comprising a concavity on its inner major surface, wherein the chip plate is sandwiched between and bonded to the lid plate and base plate to form a package containing the piezoelectric vibrating piece inside the package; wherein
the tuning-fork type piezoelectric vibrating piece has an X-direction width and a Y-direction length and comprises a base and at least pair of vibrating arms extending in the Y-direction from the base;
the tuning-fork type piezoelectric vibrating piece is coupled to the outer frame by a pair of supporting arms extending outboard of the vibrating arms in the Y-direction between the base and the outer frame and connected to the outer frame by respective connecting portions;
the lid plate includes a respective base-movement buffer situated in the concavity at a Y-coordinate corresponding to a Y-coordinate of the base; and
the base plate includes a respective base-movement buffer situated in the concavity at a Y-coordinate corresponding to a Y-coordinate of the base.

2. The piezoelectric device of claim 1, wherein the respective Y-coordinates of the base-movement buffers on the lid plate and base plate, respectively, are established relative to respective Y-direction distances of the respective base-movement buffers from a most distal end of the base, so as to prevent collision of the most distal end of the base with either of the base-movement buffers.

3. The piezoelectric device of claim 2, wherein:
the Y-coordinate of the base-movement buffer on the lid plate corresponds to a crotch region on the base between the vibrating arms; and
the Y-coordinate of the base-movement buffer of the base plate corresponds to the crotch region.

4. The piezoelectric device of claim 2, wherein:
the base-movement buffer on the base plate comprises respective first and second base-movement buffers;
the base-movement buffer on the lid plate comprises respective first and second base-movement buffers;
the first base-movement buffer on the base plate has a Y-coordinate that is located a first Y-direction distance from an X-direction centerline of the connecting portions, and the second base-movement buffer on the base plate has a Y-coordinate that is located a second Y-direction distance from the X-direction centerline;
the first base-movement buffer on the lid plate has a Y-coordinate that is located a first Y-direction distance from the X-direction centerline, and the second base-movement buffer on the lid plate has a Y-coordinate that is located a second Y-direction distance from the X-direction centerline;
for the base-movement buffers on the lid plate, a Y-direction distance between the Y-coordinate of the first base-movement buffer and the base and a Y-direction distance between the second base-movement buffer and the base are proportional to the first and second distances, respectively; and
for the base-movement buffers on the base plate, a Y-direction distance between the Y-coordinate of the first base-movement buffer and the base and a Y-direction distance between the second base-movement buffer and the base are proportional to the first and second distances, respectively.

5. The piezoelectric device of claim 4, wherein:
the Y-coordinate of the base-movement buffer on the lid plate corresponds to a crotch region between the vibrating arms on the base; and
the Y-coordinate of the base-movement buffer on the base plate corresponds to the crotch region.

6. The piezoelectric device of claim 2, wherein:
the vibrating arms include a crotch region between them on the base;
each vibrating arm comprises a respective arm portion extending from the crotch region to a respective distal end of the arm, each arm portion having a respective X-direction width;
each vibrating arm also comprises a respective hammer-head portion connected to the respective distal end, each hammer-head portion having an X-direction width greater than the X-direction width of the respective arm portion;
the concavity of the lid plate includes a lid arm-movement buffer having a Y-coordinate corresponding to a region of the arm portions situated adjacent respective hammer-head portions; and
the concavity of the base plate includes a base arm-movement buffer having a Y-coordinate corresponding to a region of the arm portions situated adjacent respective hammer-head portions.

7. The piezoelectric device of claim 6, wherein:
the base-movement buffer on the base plate comprises respective first and second base-movement buffers;
the base-movement buffer on the lid plate comprises respective first and second base-movement buffers;

the first base-movement buffer on the base plate has a Y-coordinate that is located a first Y-direction distance from an X-direction centerline of the connecting portions, and the second base-movement buffer on the base plate has a Y-coordinate that is located a second Y-direction distance from the X-direction centerline;

the first base-movement buffer on the lid plate has a Y-coordinate that is located a first Y-direction distance from the X-direction centerline, and the second base-movement buffer on the lid plate has a Y-coordinate that is located a second Y-direction distance from the X-direction centerline;

for the base-movement buffers on the lid plate, a Y-direction distance between the Y-coordinate of the first base-movement buffer and the base and a Y-direction distance between the second base-movement buffer and the base are proportional to the first and second distances, respectively; and for the base-movement buffers on the base plate, a Y-direction distance between the Y-coordinate of the first base-movement buffer and the base and a Y-direction distance between the second base-movement buffer and the base are proportional to the first and second distances, respectively.

8. The piezoelectric device of claim 6, wherein:
the Y-coordinate of the base-movement buffer on the lid plate corresponds to a crotch region between the vibrating arms on the base; and
the Y-coordinate of the base-movement buffer on the base plate corresponds to the crotch region.

9. The piezoelectric device of claim 6, wherein:
the base-movement buffer located on the lid plate and the arm-movement buffer located on the lid plate have respective X-direction widths that are less than or equal to an X-direction width of the concavity on the lid plate; and
the base-movement buffer located on the base plate and the arm-movement buffer located on the base plate have respective X-direction widths that are less than or equal to an X-direction width of the concavity on the base plate.

10. The piezoelectric device of claim 6, wherein:
the base-movement buffer on the base plate comprises respective first and second base-movement buffers;
the base-movement buffer on the lid plate comprises respective first and second base-movement buffers;
the first base-movement buffer on the base plate has a Y-coordinate that is located a first Y-direction distance from an X-direction centerline of the connecting portions, and the second base-movement buffer on the base plate has a Y-coordinate that is located a second Y-direction distance from the X-direction centerline;
the first base-movement buffer on the lid plate has a Y-coordinate that is located a first Y-direction distance from the X-direction centerline, and the second base-movement buffer on the lid plate has a Y-coordinate that is located a second Y-direction distance from the X-direction centerline;
for the base-movement buffers on the lid plate, a Y-direction distance between the Y-coordinate of the first base-movement buffer and the base and a Y-direction distance between the second base-movement buffer and the base are proportional to the first and second distances, respectively; and
for the base-movement buffers on the base plate, a Y-direction distance between the Y-coordinate of the first base-movement buffer and the base and a Y-direction distance between the second base-movement buffer and the base are proportional to the first and second distances, respectively.

11. The piezoelectric device of claim 10, wherein:
the Y-coordinate of the base-movement buffer on the lid plate corresponds to a crotch region between the vibrating arms on the base; and
the Y-coordinate of the base-movement buffer on the base plate corresponds to the crotch region.

12. The piezoelectric device of claim 1, wherein:
the vibrating arms include a crotch region between them on the base;
each vibrating arm comprises a respective arm portion extending from the crotch region to a respective distal end of the arm, each arm portion having a respective X-direction width;
each vibrating arm also comprises a respective hammer-head portion connected to the respective distal end, each hammer-head portion having an X-direction width greater than the X-direction width of the respective arm portion;
the concavity of the lid plate includes a lid arm-movement buffer having a Y-coordinate corresponding to a region of the arm portions situated adjacent respective hammer-head portions; and
the concavity of the base plate includes a base arm-movement buffer having a Y-coordinate corresponding to a region of the arm portions situated adjacent respective hammer-head portions.

13. The piezoelectric device of claim 12, wherein:
the base-movement buffer located on the lid plate and the arm-movement buffer located on the lid plate have respective X-direction widths that are less than or equal to an X-direction width of the concavity on the lid plate; and
the base-movement buffer located on the base plate and the arm-movement buffer located on the base plate have respective X-direction widths that are less than or equal to an X-direction width of the concavity on the base plate.

14. The piezoelectric device of claim 12, wherein:
the Y-coordinate of the base-movement buffer on the lid plate corresponds to a crotch region between the vibrating arms on the base; and
the Y-coordinate of the base-movement buffer on the base plate corresponds to the crotch region.

15. The piezoelectric device of claim 12, wherein:
the base-movement buffer on the base plate comprises respective first and second base-movement buffers;
the base-movement buffer on the lid plate comprises respective first and second base-movement buffers;
the first base-movement buffer on the base plate has a Y-coordinate that is located a first Y-direction distance from an X-direction centerline of the connecting portions, and the second base-movement buffer on the base plate has a Y-coordinate that is located a second Y-direction distance from the X-direction centerline;
the first base-movement buffer on the lid plate has a Y-coordinate that is located a first Y-direction distance from the X-direction centerline, and the second base-movement buffer on the lid plate has a Y-coordinate that is located a second Y-direction distance from the X-direction centerline;
for the base-movement buffers on the lid plate, a Y-direction distance between the Y-coordinate of the first base-movement buffer and the base and a Y-direction distance between the second base-movement buffer and the base are proportional to the first and second distances, respectively; and for the base-movement buffers on the base plate, a Y-direction distance between the Y-coordinate of the first base-movement buffer and the base and a Y-direction distance between the second base-movement buffer and the base are proportional to the first and second distances, respectively.

16. The piezoelectric device of claim 12, wherein:
the base-movement buffer on the base plate comprises respective first and second base-movement buffers;
the base-movement buffer on the lid plate comprises respective first and second base-movement buffers;
the first base-movement buffer on the base plate has a Y-coordinate that is located a first Y-direction distance from an X-direction centerline of the connecting portions, and the second base-movement buffer on the base plate has a Y-coordinate that is located a second Y-direction distance from the X-direction centerline;
the first base-movement buffer on the lid plate has a Y-coordinate that is located a first Y-direction distance from the X-direction centerline, and the second base-movement buffer on the lid plate has a Y-coordinate that is located a second Y-direction distance from the X-direction centerline;
for the base-movement buffers on the lid plate, a Y-direction distance between the Y-coordinate of the first base-movement buffer and the base and a Y-direction distance between the second base-movement buffer and the base are proportional to the first and second distances, respectively; and
for the base-movement buffers on the base plate, a Y-direction distance between the Y-coordinate of the first base-movement buffer and the base and a Y-direction distance between the second base-movement buffer and the base are proportional to the first and second distances, respectively.

17. The piezoelectric device of claim 16, wherein:
the Y-coordinate of the base-movement buffer on the lid plate corresponds to a crotch region between the vibrating arms on the base; and
the Y-coordinate of the base-movement buffer on the base plate corresponds to the crotch region.

18. The piezoelectric device of claim 1, wherein:
the base-movement buffer on the base plate comprises respective first and second base-movement buffers;
the base-movement buffer on the lid plate comprises respective first and second base-movement buffers;
the first base-movement buffer on the base plate has a Y-coordinate that is located a first Y-direction distance from an X-direction centerline of the connecting portions, and the second base-movement buffer on the base plate has a Y-coordinate that is located a second Y-direction distance from the X-direction centerline;
the first base-movement buffer on the lid plate has a Y-coordinate that is located a first Y-direction distance from the X-direction centerline, and the second base-movement buffer on the lid plate has a Y-coordinate that is located a second Y-direction distance from the X-direction centerline;
for the base-movement buffers on the lid plate, a Y-direction distance between the Y-coordinate of the first base-movement buffer and the base and a Y-direction distance between the second base-movement buffer and the base are proportional to the first and second distances, respectively; and
for the base-movement buffers on the base plate, a Y-direction distance between the Y-coordinate of the first base-movement buffer and the base and a Y-direction distance between the second base-movement buffer and the base are proportional to the first and second distances, respectively.

19. The piezoelectric device of claim 18, wherein:
the Y-coordinate of the base-movement buffer on the lid plate corresponds to a crotch region between the vibrating arms on the base; and
the Y-coordinate of the base-movement buffer on the base plate corresponds to the crotch region.

20. The piezoelectric device of claim 1, wherein:
the Y-coordinate of the base-movement buffer on the lid plate corresponds to a crotch region between the vibrating arms on the base; and
the Y-coordinate of the base-movement buffer on the base plate corresponds to the crotch region.

* * * * *